(12) United States Patent
Ehrichs

(10) Patent No.: US 6,169,960 B1
(45) Date of Patent: Jan. 2, 2001

(54) METHOD FOR DETERMINING THE DAMAGE POTENTIAL OF THE DIFFERENT TYPES OF WAFER DEFECTS

(75) Inventor: Edward E. Ehrichs, Austin, TX (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 08/884,524

(22) Filed: Jun. 27, 1997

(51) Int. Cl.[7] .................................................. G06F 15/00
(52) U.S. Cl. ......................................... 702/36; 395/500.2
(58) Field of Search ................. 702/35, 36; 364/468.17, 364/468.28; 356/237.1; 382/149; 324/763, 765; 395/500.2, 500.6; 257/503, 537

(56) References Cited

U.S. PATENT DOCUMENTS

| | | | | |
|---|---|---|---|---|
| 5,128,737 | * | 7/1992 | Van Der Have | 357/40 |
| 5,777,901 | * | 7/1998 | Berezin et al. | 395/500.2 |

* cited by examiner

Primary Examiner—Kamini Shah
(74) Attorney, Agent, or Firm—Kevin L. Daffer; Conley, Rose & Tayon

(57) ABSTRACT

A method is presented for devising a model to determine the damage potential of wafer defects. The model takes into account both the defects' type and size. Wafer defects are the most major cause of depressed yields in semiconductor manufacturing. The wafers are first scanned to detect and identify the defects. There are several available tools that can detect and/or categorize the defects by type and size. A model is then formed to predict the probability (single probability) that a single defect on a die will not cause it to be nonfunctional. This model must depend on the size of the defect and an additional undetermined parameter which is specific to the type of the defect. Assuming that the effect of different defects is independent, the probability that a die will be functional when having multiple defects is then simply given by the product of all the single probabilities. At the end of the manufacturing process, the wafers can be electrically tested to determine whether the die are functional or not. An error function can then be formed by adding together the square of: for functional die, one minus the predicted probability; for nonfunctional die, the predicted probability minus zero. A good model should predict close to one for functional die and close to zero for nonfunctional die. By numerically minimizing this error function, the undetermined parameters can be computed. These parameters can then be used to predict the damage potential of defects for future wafers.

22 Claims, 6 Drawing Sheets

| Defect # | Die (x, y coord.) | Size (μm) | Type (A, B, C...) |
|---|---|---|---|
| 1 | (2,3) | 0.2 | G |
| 2 | (2,6) | 0.5 | Z |
| 3 | (5,8) | 0.06 | R |
| . | . | . | . |
| . | . | . | . |
| . | . | . | . |

METHOD FOR DETERMINING THE DAMAGE POTENTIAL OF THE DIFFERENT TYPES OF WAFER DEFECTS

BACKGROUND OF THE INVENTION

1. Field of the Invention

This invention relates to the field of semiconductor processing and, more particularly, to a method for determining the damage potential of defects that occur during the manufacturing of semiconductor devices.

2. Description of Relevant Art

The manufacturing of integrated circuits involves the formation of devices upon semiconductor wafers, typically silicon wafers. The manufacturing of the devices involves a sequence of physical and/or chemical processes for the formation of structures and layers upon or proximal to the upper surface of the wafer. These processes include the introduction of external species into the substrate(either by diffusion or implantation), patterning using photolithography techniques, removing material using wet or dry etching, polishing using mechanical and/or chemical means, chemical and/or physical vapor deposition or thermal growing of films, as well as other physical and chemical processes.

Each wafer is subdivided into several sites, called die, their number depending on the size of each die and the size of the wafer. The different die or "chips" can be microprocessors, static random access memories, dynamic random access memories, flash memories, or other forms of integrated circuits. In the past 25 years, the diameter of silicon wafers has steadily increased from less than 1 in to 8 in (200 mm) diameter wafers which are currently used by many semiconductor manufacturing companies.

Throughout the history of semiconductor wafer processing, a challenge has been to maximize the yield of functional die on a given wafer. Many steps in the manufacturing process can cause a die to become nonfunctional and thus depress the yield. A die is considered nonfunctional even if the device is functioning but certain critical parameters are not within the design specifications. The word functional herein after refers to functioning die with parameters which are within the design specifications. Defects that can occur in these manufacturing steps are the major cause of depressed yields. Defects can be caused by foreign matter, patterning problems, or by a faulty process.

Small particles are a common cause of defects. Small particles found in the air can attach themselves to the wafer and interfere with the manufacturing process. Most modern fabrication laboratories try to minimize small particles in the air by maintaining a clean environment using special filters and high circulation of air. The density of small particles in the air in modem manufacturing "clean rooms" can be as low as 1 particle per cubic foot.

Faulty processing equipment can also be a source of foreign matter. For example, a rubber o-ring can break into small particles which can be deposited upon the surface of the wafer. Deposition tools may collect deposits upon the equipment's sidewalls which can later break away and again be deposited upon the surface of the wafer. Human hair and even saliva from operating technicians may also cause defects to the wafers. Gas-phase nucleation is another source of process induced particles.

Photolithography is the most popular technique used in semiconductor manufacturing for defining structures upon wafers. Typically, a layer of the material to be patterned is first deposited. A layer of photoresist is deposited upon that layer and the photoresist is then exposed using a mask and a form of radiation that typically breaks down the photoresist (positive photoresist). Negative photoresist, which requires radiation to form bonds and thus become resistant to being developed, is also available. Subsequently, the exposed photoresist may be removed with the appropriate developer. Many of the defects on a wafer occur during this patterning process. If the mask is not in perfect alignment with the wafer, the pattern is misaligned and, depending on the severity of the defect and the misalignment, the particular die may become nonfunctional. Particles on the back side of the wafer or top of the chuck cause small areas of the wafer to be out of focus causing "hot spots" or local areas poorly resolved patterns. Bubbles in the developer can cause some areas not to be developed away.

Foreign matter that may exist on the mask may also cause defects since it may cause a portion of the photoresist not to be exposed to the radiation source. A non-exposed portion of the photoresist will not be etched away and thus create additional features on the wafer with the possibility of causing damage.

A first step in eliminating or reducing defects is their detection and classification. There are two major categories of tools currently used in the industry for the detection of defects. The first category of tools uses laser scanning of the wafer. A laser beam is scanned across the surface of the wafer as the wafer is scanned. The presence of particles is expected to change the scattering of the beam. Such tools are relatively fast in scanning wafers and finding defects. These tools are usually not capable of detecting planar defects or previous level defects.

A second category of defect detection and classification tools is image comparison tools. Image comparison tools typically form an image of a particular die by shining white light on the wafer and then detecting the image with a microscope and a charge-coupled device camera. Using special algorithms, the image of each die is then compared to the image of two neighboring die. A defect is assumed when corresponding pixels of the images differ in contrast by more than a certain threshold. Image comparison tools are typically slower in processing wafers due to the computation time required for all the image comparisons. However, image comparison tools are good at finding planar defects and previous layer defects.

After the defects are found, an operator or an automated defect classification tool will review and classify the defects. The defects are also sorted according to which die they were found on. As many as 1000 defects can be found on a particular die. Typically, not all of those defects will cause a die to fail. Operators and engineers need to focus their resources on determining the origin of the most harmful. There is no need to waste resources on defects that are too small or the wrong type to cause any significant die failure. In the past, the damage potential of each type of defect was determined by the percentage of functional die with only one of a given type of defect. However, this simple model does not take into account the size of the defect. In addition, the model requires the existence of many die with only one type of defect. It would thus be desirable to have a model that takes into account the size of the defect and a technique for determining the damage potential of each type of defect even if multiple defects exist on a given die.

SUMMARY OF THE INVENTION

A model is first formed to predict the probability (single probability) that a single defect on a die will not render that die nonfunctional. This model depends on a single, undetermined parameter, which is specific to the type of that particular defect, as well as on the size of the defect. In a preferred embodiment, only one undetermined parameter is preferably used to avoid statistical error which can occur from too many free parameters in a model. The expected probability in this single defect model should have the general behavior of initially decreasing linearly with the size of the defect and then taper off and approach 0 as the size keeps increasing. An initial threshold defect size may also exist. That is, in some cases it may be reasonable to assume that the probability remains at 1 up to a certain threshold size before linearly decreasing. Assuming that the effect of different defects is statistically independent, the probability that a die will be functional when multiple defects exist on the die (die probability) is then simply given by the product of all the single probabilities.

After the end of the manufacturing process, a wafer map is produced by electrically testing all the die on a wafer. The wafer map indicates whether the die are functional or not. An error function is then formed by adding together the square of: for functional die, 1 minus the predicted probability; for nonfunctional die, the predicted probability minus 0. A perfect model will predict 1 for functional die and 0 for nonfunctional die. By numerically minimizing this error function, the undetermined parameters may then be computed. These parameters can be used to predict the damage potential of defects for future wafers. Furthermore, the error function may be used to evaluate different probability models. A better model will yield a smaller value for the error function after minimization.

Broadly speaking, the present invention contemplates a method for determining the damage potential of wafer defects in semiconductor manufacturing. A wafer is provided, comprising a plurality of die sites. A defect data base is produced from a plurality of defects on the wafer. The data base contains information on the location, the size, and the type of each defect. A model to predict the die probability that a certain die is functional is then proposed. The model uses the defect data base and a plurality of undetermined parameters. Each die is then tested after the end of manufacturing to determine whether the die is functional or nonfunctional. The undetermined parameters are computed by numerically minimizing a difference between the wafer map and the predictions of the model.

The defect data base may be produced by optically scanning the wafers. The wafers may be scanned by a laser scanning tool or an image comparison tool. To propose a die model to predict whether a certain die is functional a single model is first proposed to predict a single probability that a single defect will cause a given die to be nonfunctional. The die probability whether a certain die is functional is then obtained by forming a product of a plurality of the first probabilities corresponding to the defects present on that die.

In a preferred embodiment, proposing the single model may comprise using an exponential function, wherein an exponent of the exponential function comprises the negative of the product of the size of the defect and the undetermined parameter corresponding to that defect. In an alternative embodiment, forming the single model may comprise using an exponential function, wherein an exponent of the exponential function comprises the negative of the product of the square of the size of the defect and the undetermined parameter corresponding to that defect. The single model may further comprise multiplying the plurality of the single probabilities with an additional parameter representative of any additional factors that may cause a die to be nonfunctional.

The step of testing each die comprises electrical testing which sorts the die into functional die and nonfunctional die. The step of determining a plurality of the undetermined parameters comprises numerically adding together: the square of 1 minus the predicted probability that a die is functional for all the functional die; and the square of the predicted probability that a die will be functional minus 0 for all nonfunctional die. The computed undetermined parameters are used to characterize the damage potential of the defects. Only one undetermined parameter is used for each type of defect.

BRIEF DESCRIPTION OF THE DRAWINGS

Other objects and advantages of the invention will become apparent upon reading the following detailed description and upon reference to the accompanying drawings in which.

Figure 1:
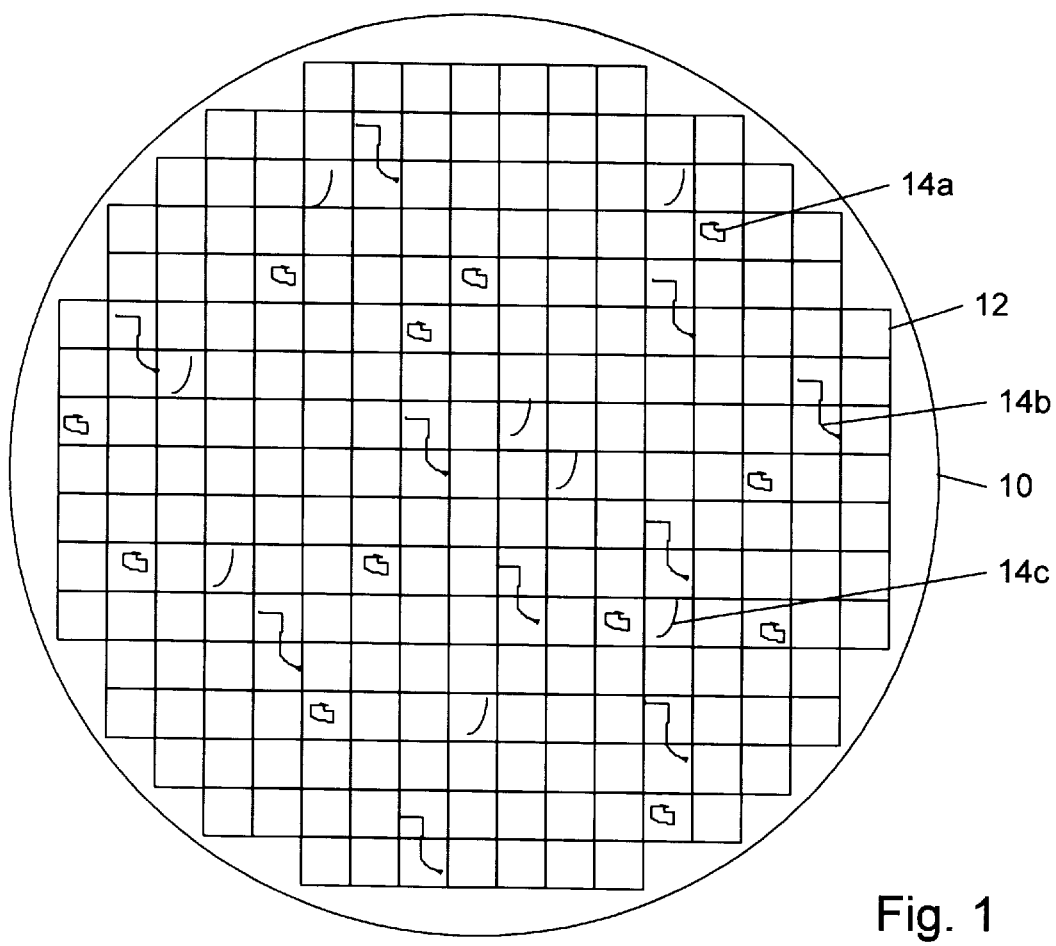
FIG. 1 is a top-view of a wafer subdivided into several die for the formation of semiconductor devices.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the figures, FIG. 1 shows an example wafer 10 subdivided into several die 12. Different defect types 14a, 14b, and 14c are shown on several of the die on the wafer.

Figures 2, 3:
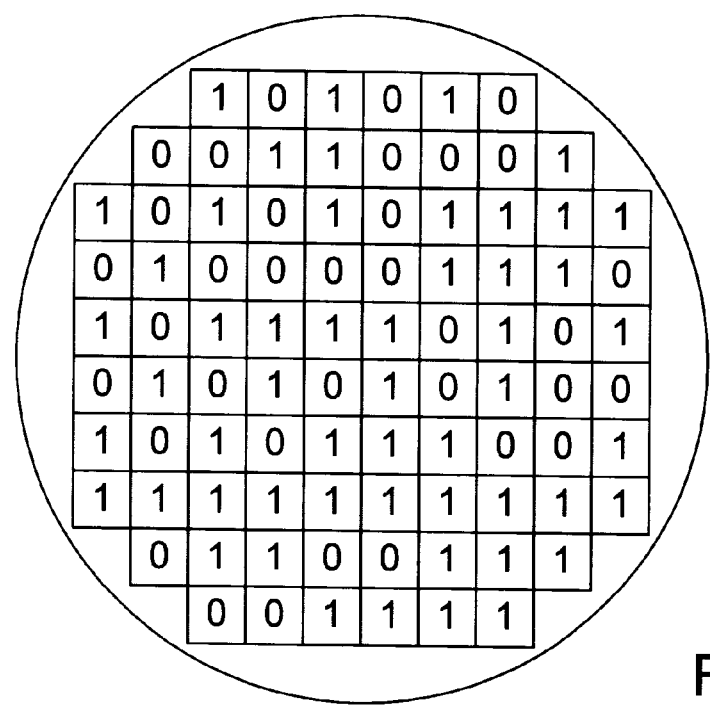
FIG. 2 is a table describing each detected defect's location, size and type.
FIG. 3 is a wafer map showing all functional die with a "1" and all non-functional die with a "0"

The wafer is first scanned either by an image comparison tool, a laser scanning tool, or a combination of the two in order to detect most or all the defects on the wafer. A defect data base is produced containing information on the location, the size, and the type of each defect on the wafer. An example of such a data base is shown in FIG. 2. The data base contains information on which die each defect is located on, the size of the defect in and the type of the defect. The classification of the defects into different types may be performed either by automatic defect classification tools or manually by experienced operators and engineers.

A wafer map is then constructed with information on the functionality of each die. Electrical testing after the end of the manufacturing cycle can determine whether a die is actually functional or nonfunctional. An example of such a wafer map is shown in FIG. 3. Functional die are represented by 1s and nonfunctional die by 0s.

A model of the probability that a die will be functional is then proposed. The first part of the model only attempts to predict the probability that a die will be functional when a single defect exists on that die (hereinafter referred to as single probability). The model should account for the type of each defect with one parameter as well as for the size of each defect with another parameter. For each defect, the size is known from scanning the wafer, while the second parameter specific to the type of the defect is free and is to be determined. Only one free parameter is used per defect type because of the increase in statistical error that occurs with the introduction of additional parameters. Any model can be made to fit any data given enough free parameters.

In an alternative embodiment, one free parameter may be assigned to each fabrication level where defects exist if the type of each defect is not detected. Each semiconductor device is manufactured in different levels, which usually include interlevel dielectrics and metal layers. Defects can occur at each level and can be grouped together under one free parameter. Such a model would then predict a single probability for a certain defect found at a given level of the fabrication process.

Figure 4:
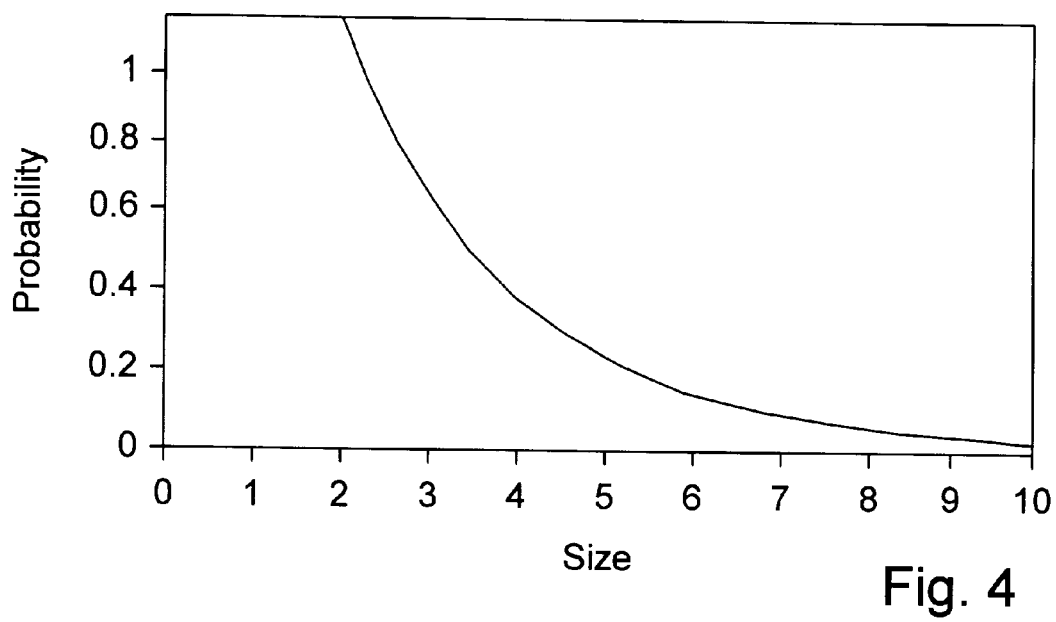
FIG. 4 is graph representing a possible model for the probability that a defect will render a die nonfunctional vs. the size of the defect.
Figure 5:
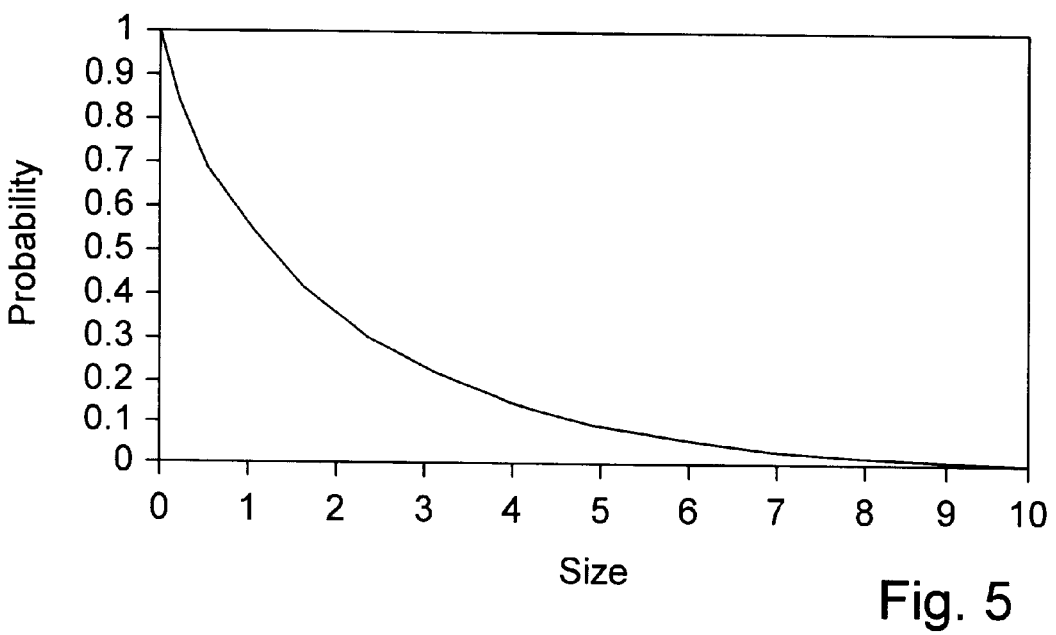
FIG. 5 is graph representing an exponential approximation to the model of FIG. 1 with only one free parameter.
Figure 6:
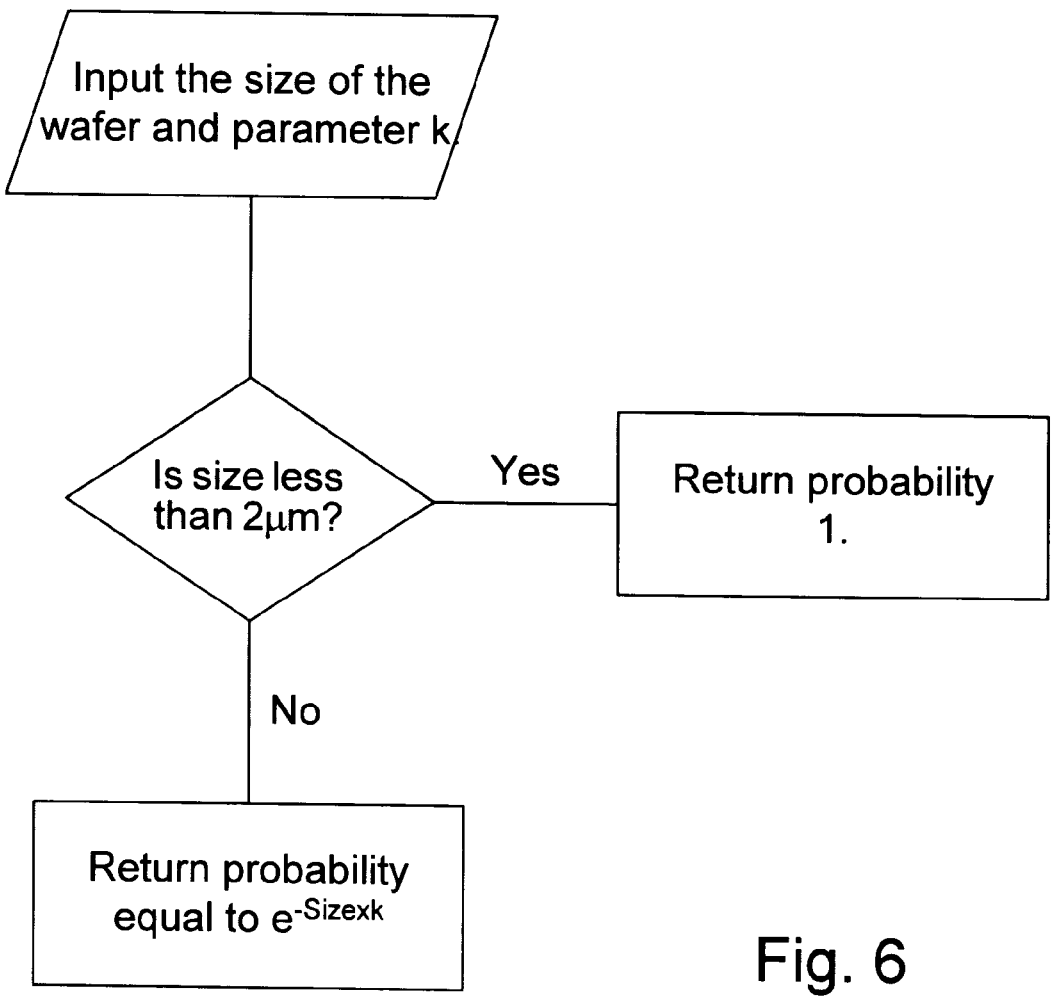
FIG. 6 is a flowchart describing a function for approximating the expected probability that a single defect will not render a die nonfunctional.

A good expectation for the single probability vs. defect size is shown in FIG. 4. It is expected that as the size of the defect increases from 0, the single probability will remain initially at 1. The initial increase in size is expected to have no effect on the probability. Beyond a certain threshold defect size, the single probability is expected to begin linearly decreasing with size and then taper off approaching 0. The threshold size, the initial slope in the probability decrease, and the general shape of the graph are expected to depend on the type of the defect. In a preferred embodiment, the analytical, mathematical function $$p_i = e^{-k_i s},$$

which is shown in FIG. 5, may be used to approximate this expected behavior. Here, $p_i$ is the single probability that a defect of the ith type will not render a die nonfunctional (i.e., the probability that the die will be functional when only one type of defect exists on it), $k_i$ is a free, undetermined parameter specific to the damage potential of the ith type of defect and, s is the size of the defect as measured by the scanning tool. This exponential function does not capture the expected threshold defect size but has many other of the expected features of the expected single probability. Other similar functions with one free parameter per type of defect may also be used. A function written in computer code with two inputs (one for the size and one for the undetermined free parameter) and one output (for the single probability) and several conditional statements may also be used. An example of such a function is shown in the flow chart of FIG. 6. Other analytical functions that may be used are $$p_i = \frac{1}{1 + k_i s^n}.$$

Here n is a number that can be chosen as the power.

In general, a given die will have more than just one defect contributing to the probability that the die is functional. Assuming that the defects are statistically independent from one another, the probability that a die with multiple defects is functional is simply given by the product of the single probabilities. That is, if the probability that a die containing a single defect is functional is given by $p_i$, the probability that the die is functional when having multiple defects is given by $$P_d = \prod_{defects} p_i,$$

where the product is over all the defects on that die. This probability concerning the whole die is herein after refer to as die probability. Since it is also possible that a die will fail due to additional factors that may not be reflected by all the detected defects, an additional background probability term may be added to the above equation to account for these additional background factors. The new equation is $$P_d = \left(\prod_{defects} p_i\right) \times p_b,$$

where $p_b$ represents the probability that a die has failed due to something other than the known defects. If the exponential model is assumed, the above equation becomes $$P_d = e^{-(k_1 s_1 + k_2 s_2 + k_3 s_3 + \ldots k_n s_n + k_b)},$$

where the probability $p_b$ has been rewritten in the exponential form $e^{-k_b}$ and where n is the number of defects on that die. Since there is no size associated with the background probability, $k_b$ is dimensionless.

The predicted results of the model are then compared to the wafer map obtained by electrically testing the wafer to compute the undetermined parameters k (or whatever the parameters of the particular chosen model may be). For a functional die, a perfect model should have a predicted probability of 1, and for a nonfunctional die, a perfect model should have a predicted probability of 0. The error in each prediction of a given model is then given by $(1-P_d)$ for a functional die and $(P_d-0)$ for a nonfunctional die. The total error in the predictions of a particular model may then be measured by calculating the error function $$F_{Err} = \sum_{dice} \begin{cases} (1 - P_d)^2; \text{Die is functional} \\ (P_d - 0)^2; \text{Die is nonfunctional} \end{cases}.$$

The error function $F_{Err}$ is the sum of the squares of the difference between the prediction that the model makes for a particular die and the actual result of the electrical testing. A better model will have a smaller $F_{Err}$. Thus, the determination of all undetermined parameters k is accomplished by minimizing the quantity $F_{Err}$ with respect to all of the undetermined parameters. Since there are typically up to 20 different types of defects on a wafer, the equation is minimized numerically using a computer. There are many commercially available numerical routines that can accomplish this. In addition, the error function $F_{Err}$ may be used to evaluate different proposed single probability models. A minimum value for the error function may be obtained for all the candidate functions to determine which one is the best for that particular wafer. Different functions and different parameters within a given function may be appropriate for wafers with different types of devices.

Figure 7:
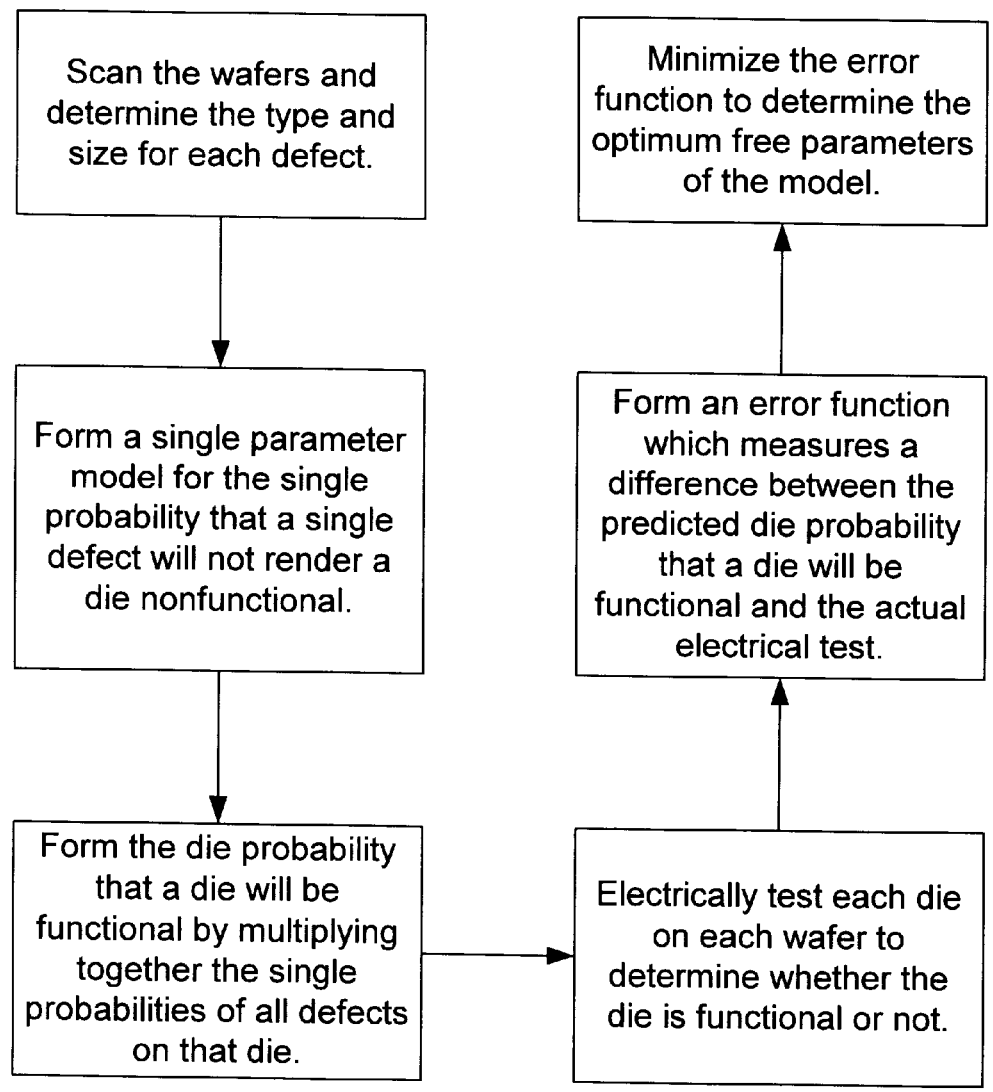
FIG. 7 is a flowchart describing the method for determining the free parameters in the model for the damage potential of defects.
Figure 8:
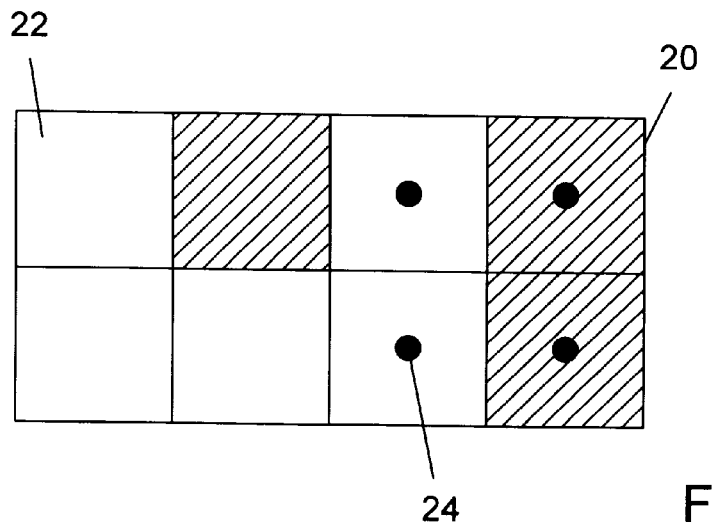
FIG. 8 is a top view of a wafer with 8 die, wherein the wafer is used in an example to illustrate the method described herein.

An outline of how the method works is shown in the flowchart of FIG. 7. As an example of how this method may be applied, consider wafer 20 with die 22 shown in FIG. 8. Our simple example assumes only one type of defect represented here by black dots 24. We will also assume that all four defects shown here have equal size which is further assumed to be unity. The unshaded die are die which, during electrical testing, were found to be functional, and the shaded die are die which were found to be nonfunctional. According to the exponential model, the single probability that a die without a defect is functional is $$P_d = e^{-k_b}$$

and the single probability that a die with a defect is functional is $$P_d = e^{-(k_b + k)}$$

Only one parameter k is used since there is only one type of defect present. By taking into account the results of the electrical testing (shaded or unshaded die), we can form the error function $F_{Err}$ which in this case is $$F_{Err} = 3(1 - e^{k_b})^2 + (e^{k_b})^2 + 2(e^{-(k_b + k)})^2 + 2(1 - e^{-(k_b + k)})^2$$

Figure 9:
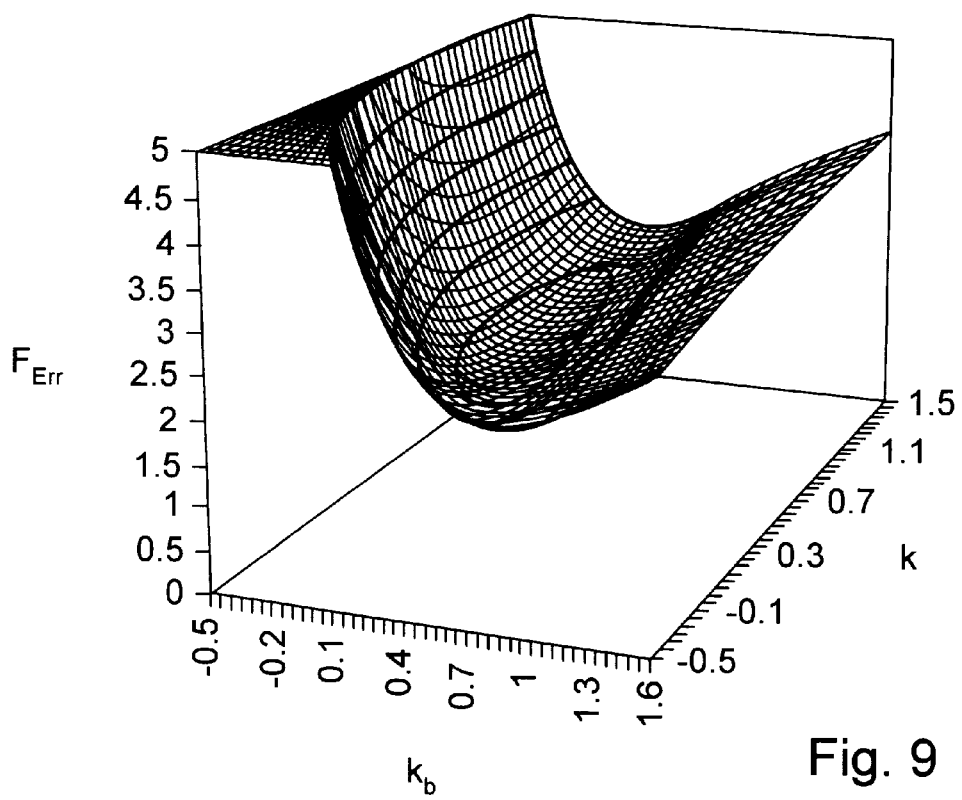
FIG. 9 is graph of the error function vs. the undetermined defect type parameter k and the undetermined background parameter $k_b$.

FIG. 9 shows a two-dimensional plot of the function $F_{Err}$ vs. the variables k and $k_b$. Using a numerical routine, the values that minimize the function are found to be k=0.405 and $k_b$=0.288. In general, the $F_{Err}$ error function will be n-dimensional, where n will be equal to the number of defect types plus one for the background parameter. In this simple example, the above result can be checked by observing that 3 out of 4 die without a defect are functional (i.e. $P_d = e^{-k_b} = 0.75$), and that 2 out of 4 die with defects are functional (i.e. $P_d = e^{-(k_b + k)} = 0.5$). The first equation yields $k_b$=0.288, which can be substituted into the second equation to obtain k=0.405. These are the same results that were obtained by the numerical minimization method.

Information about the accuracy of one of the parameters k may be obtained by computing the second derivative of $F_{Err}$ in the direction of that parameter. The second derivative gives information about the curvature of the function $F_{Err}$ around the minimum and in the direction of that parameter. If the curvature of the function $F_{Err}$ is large in the direction of a particular parameter, that is an indication that the value of that particular parameter is trustworthy. A small curvature is an indication of a not-so-definite minimum in that direction.

The above model is only tested with wafers of a particular type of device. The k parameters obtained by this technique are only valid for that particular type of device. A different type of device or die size would require a new set of k parameters since the sensitivity to defects of various sizes and types is generally device dependent. If data from multiple wafers is used simultaneously, then it is probably a good idea to use a different $k_b$ for each wafer, particularly if there is significant variation of yield within a given lot. Different wafers which were processed under different conditions may have a significantly different background probability.

Once the k parameters are obtained, they can be used to predict wafer and lot yield for wafers which are not yet at the stage of electrical testing. In addition, it is possible to determine how many die have been killed by each type of defect and thus, the relative importance of cleaning up each type of defect. This can save unnecessary time of trying to determine the cause for defects that do not have much damage potential.

It will be appreciated to those skilled in the art having the benefit of this disclosure that this invention is believed to be capable of predicting the damage potential of defects in semiconductor manufacturing. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for determining damage potentials of various wafer defects in semiconductor manufacturing, comprising:
   providing a semiconductor wafer comprising a plurality of die sites;
   producing a defect data base from a plurality of defects on said wafer, wherein said data base comprises a location, a size, and a type of each of said defects;
   testing each of said die to produce a wafer map indicating whether each of said die is functional or nonfunctional;
   proposing a die model for predicting a die probability that one of said die is functional, wherein said die probability is a function of said location, said size, and said type of said defects, wherein said proposing said die model to predict said die probability that one of said die is functional comprises:
   proposing a single model for predicting a plurality of single probabilities that one of said die will be functional when only a single defect exists on said die; and
   computing said die probability by forming a product of said single probabilities corresponding to all defects on said die; and
   minimizing an error function by modifying said proposed die model, wherein said error function comprises a difference between said wafer map and said proposed die model.

2. The method as recited in claim 1, wherein the step of producing said defect data base comprises optical scanning of said wafer.

3. The method as recited in claim 2, wherein the step of optical scanning of said wafer is performed with a laser scanning tool.

4. The method as recited in claim 2, wherein the step of optical scanning of said wafer is performed with an image comparison tool.

5. The method as recited in claim 1, wherein the step of computing said die probability further comprises multiplying said single probabilities with an additional probability, wherein said additional probability is representative of any additional factors that may cause a die to be nonfunctional.

6. The method as recited in claim 1, wherein the step of proposing said single model comprises an exponential function, wherein an exponent of said exponential function comprises the negative of the product of said size of one of said defects and an undetermined parameter corresponding to said type of said defect.

7. The method as recited in claim 1, wherein said the step of proposing said single model comprises an exponential function, wherein an exponent of said exponential function comprises the negative of the product of the square of said size of one of said defects and an undetermined parameter corresponding to said type of said defect.

8. The method as recited in claim 1, wherein the step of testing each of said die comprises electrical testing, wherein said electrical testing sorts the die into functional die and nonfunctional die.

9. The method as recited in claim 1, wherein said error function comprises the sum of:
   for all said functional die, the square of 1 minus said die probability; for all said nonfunctional die, the square of said die probability minus 0.

10. The method as recited in claim 1, wherein the step of modifying said proposed die model comprises changing the value of a plurality of undetermined free parameters of said die model.

11. The method as recited in claim 10, wherein said undetermined parameters are used to characterize said damage potential of said defects and wherein each of said undetermined parameters corresponds to one of said types of said defects.

12. The method as recited in claim 1, wherein the step of minimizing said error function comprises numerically/computationally minimizing said error function.

13. A memory medium comprising:
   a defect data base comprising a location, a type, and a size of a plurality of defects of a semiconductor wafer, wherein said wafer comprises a plurality of die sites;
   a wafer map obtained by testing said die, wherein said wafer map indicates whether each of said die is functional or nonfunctional;
   a die model for predicting a die probability that one of said die is functional, wherein said die probability is a function of said location, said type, and said size of said defects, wherein said die model comprises:
      a single model for predicting a plurality of single probabilities that one of said die will be functional when only a single defect exists on said die; and
      a product of said single probabilities corresponding to all defects on said die;
   an error function comprising a difference between said wafer map and said proposed die model.

14. The memory medium of claim 13, wherein said single probability is a function of said size of said defect and an undetermined parameter, wherein said undetermined parameter corresponds to said type of said defect.

15. The memory medium of claim 13, wherein said product further comprises an additional probability, wherein said additional probability is representative of any additional factors that may cause a die to be nonfunctional.

16. The memory medium of claim 13, wherein said single model comprises an exponential function, wherein an exponent of said exponential function comprises the negative of the product of said size of one of said defects and one of said undetermined parameters corresponding to said type of said defect.

17. The memory medium of claim 13, wherein said single model comprises an exponential function, wherein an exponent of said exponential function comprises the negative of the product of the square of said size of one of said defects and one of said undetermined parameter corresponding to said type of said defect.

18. The memory medium of claim 13, wherein said wafer map is obtained by electrical testing of said die.

19. The memory medium of claim 13, wherein said error function comprises the sum of:
   for all said functional die, the square of one minus said die probability; for all said nonfunctional die, the square of said die probability minus zero.

20. The memory medium of claim 13, wherein said error function is minimized numerically/computationally.

21. The memory medium of claim 14, wherein said location of each of said defects comprises a die on which each of said defects is located.

22. The memory medium of claim 14, wherein said location of each of said defects comprises a fabrication level on which each of said defects is located.

* * * * *